United States Patent
Xu et al.

(10) Patent No.: US 10,582,629 B2
(45) Date of Patent: Mar. 3, 2020

(54) FLEXIBLE DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Shaopeng Xu, Beijing (CN); Hao Wu, Beijing (CN); Xuzhong Liu, Beijing (CN); Na An, Beijing (CN); Zongwei Luo, Beijing (CN); Baolei Guo, Beijing (CN); Xiao Ma, Beijing (CN); Bin Xu, Beijing (CN); Zheng Zhang, Beijing (CN); Zhenhua Luo, Beijing (CN); Wei Su, Beijing (CN); Qingzhu Guan, Beijing (CN); Xinfeng Gong, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/306,246

(22) PCT Filed: Apr. 10, 2018

(86) PCT No.: PCT/CN2018/082420
§ 371 (c)(1),
(2) Date: Nov. 30, 2018

(87) PCT Pub. No.: WO2018/214656
PCT Pub. Date: Nov. 29, 2018

(65) Prior Publication Data
US 2019/0141849 A1    May 9, 2019

(30) Foreign Application Priority Data
May 26, 2017   (CN) .......................... 2017 1 0387507

(51) Int. Cl.
*H04M 1/02* (2006.01)
*G06F 1/16* (2006.01)
(Continued)

(52) U.S. Cl.
CPC ........... *H05K 5/0221* (2013.01); *F16H 21/44* (2013.01); *G06F 1/1652* (2013.01); *G09F 9/301* (2013.01);
(Continued)

(58) Field of Classification Search
CPC . H04M 1/0235; H04M 1/0237; H04M 1/1652
(Continued)

(56) References Cited

U.S. PATENT DOCUMENTS 6,064,734 A * 5/2000 Hasegawa ........... H04M 1/0235
                                                      379/433.07
2004/0198437 A1* 10/2004 Yamamoto .......... H04M 1/0237
                                                      455/556.1
(Continued)

FOREIGN PATENT DOCUMENTS

CN        102172000 A    8/2011
CN        105518769 A    4/2016
(Continued)

OTHER PUBLICATIONS

First Office Action for CN Appl. No. 201710387507.0, dated Sep. 5, 2018, 13 pages with translation.
(Continued)

*Primary Examiner* — Adrian S Wilson
(74) *Attorney, Agent, or Firm* — Foley & Lardner LLP; James F. Ewing; Paul M. H. Pua

(57) ABSTRACT

Embodiments of this disclosure provide a flexible display device. The flexible display device comprises a flexible display panel and a folding mechanism. The folding mechanism comprises a first cabinet and a second cabinet overlapping each other, and a guiding mechanism. The second cabinet can move straight relative to the first cabinet through the guiding mechanism. The flexible display device further comprises a guiding portion and an adjusting lever in the second cabinet. The guiding portion is at a push-pull end of the second cabinet. The adjusting lever can move between the push-pull end and an end opposite to the push-pull end. One end of the flexible display panel is fixed to the push-pull end of the first cabinet, and the other end is fixed to the adjusting lever in an opposite direction. A locking mechanism fixes relative positions of the first cabinet, the second cabinet and the adjusting lever.

18 Claims, 14 Drawing Sheets

(51) Int. Cl.
*H05K 5/02* (2006.01)
*H05K 5/00* (2006.01)
*G09F 9/30* (2006.01)
*F16H 21/44* (2006.01)

(52) U.S. Cl.
CPC ....... *H04M 1/0235* (2013.01); *H04M 1/0237* (2013.01); *H05K 5/0017* (2013.01); *H05K 5/0226* (2013.01)

(58) Field of Classification Search
USPC ...................................... 455/575.4
See application file for complete search history.

(56) References Cited

U.S. PATENT DOCUMENTS

| | | | |
|---|---|---|---|
| 2006/0270445 A1* | 11/2006 | Miramontes | H04M 1/0208 455/550.1 |
| 2011/0287819 A1* | 11/2011 | Lee | H04M 1/0237 455/575.4 |
| 2016/0147261 A1 | 5/2016 | Bohn et al. | |

FOREIGN PATENT DOCUMENTS

| | | |
|---|---|---|
| CN | 106971673 A | 7/2017 |
| JP | 2005-309086 A | 11/2005 |
| TW | 200627945 A | 8/2006 |

OTHER PUBLICATIONS

International Search Report and Written Opinion for International Appl. No. PCT/CN2018/082420, dated Jun. 20, 2018.
Second Office Action for CN Appl. No. 201710387507.0, dated Mar. 14, 2019, 16 pages with translation.
Third Office Action for CN Appl. No. 201710387507.0, dated May 10, 2019, 8 pages with translation.

* cited by examiner (a)

(b)

(a)

(b)

FLEXIBLE DISPLAY DEVICE

CROSS-REFERENCE TO RELATED APPLICATIONS

This application claims priority under 35 U.S.C. § 371 to International Patent Application No. PCT/CN2018/082420 filed on Apr. 10, 2018, which claims the benefit of and priority to Chinese Patent Application No. 201710387507.0 filed on May 26, 2017, which is hereby incorporated by reference in its entirety into this application for all purposes.

TECHNICAL FIELD

The present disclosure relates to a flexible display device.

BACKGROUND

With the continuous development of display technologies, flexible display devices are increasingly used in the curved display field, the wearable display field and etc., because of their own bendable and foldable characteristics, so they become a hot spot of attention in the display field in recent years.

By use of the bendable and foldable characteristics of the flexible display devices themselves, more and more flexible display products come into people's daily life in recent years, but most of the flexible display products need artificial and manual bending of the screen to achieve a fixed shape, so that the user experience is low.

Therefore, there is a need to provide an improved flexible display device.

SUMMARY

An embodiment of this disclosure provides a flexible display device comprising a flexible display panel and a folding mechanism; wherein the folding mechanism comprises a first cabinet and a second cabinet overlapping each other, and a guiding mechanism, wherein the second cabinet is able to move in a straight line direction relative to the first cabinet through the guiding mechanism; the flexible display device further comprises a guiding portion and an adjusting lever in the second cabinet, wherein the guiding portion is at a push-pull end of the second cabinet; the adjusting lever is able to move between the push-pull end of the second cabinet and an end of the second cabinet opposite to the push-pull end; an end of the flexible display panel is fixed to a push-pull end of the first cabinet, and the other end of the flexible display panel wraps around the guiding portion and is fixed to the adjusting lever in an opposite direction; and a locking mechanism configured to fix relative positions of the first cabinet, the second cabinet and the adjusting lever.

In an example, the first cabinet is above the second cabinet, and an upper surface of the first cabinet is in fixed contact with portions of the flexible display panel at corresponding locations.

In an example, the guiding mechanism comprises a first set of guide groove and guide rail on opposite sides of the first cabinet and the second cabinet respectively, and the guide groove and the guide rail are arranged to face each other.

In an example, the guiding mechanism further comprises a second set of guide groove and guide rail arranged to face each other, and the first set of guide groove and guide rail and the second set of guide groove and guide rail are at two edges of a set of opposite sides of the first cabinet and the second cabinet facing each other in a direction perpendicular to the direction in which the second cabinet moves, respectively.

In an example, the guiding mechanism comprises: a hinged five-bar mechanism between opposite sides of the first cabinet and the second cabinet, wherein the hinged five-bar mechanism comprises a frame, two side links and two connecting rods connected end-to-end to form a closed kinematic chain, wherein the closed kinematic chain is symmetrical with respect to a perpendicular bisector of the frame; the end of the first cabinet opposite to the push-pull end of the first cabinet forms the frame.

In an example, the second cabinet has a cavity structure, wherein the adjusting lever is in the cavity structure, and a lower surface of the guiding portion is approximately in the same horizontal plane as the adjusting lever.

In an example, the upper surface of the second cabinet is provided with two curved grooves, and the two curved grooves are symmetrical with respect to the perpendicular bisector of the frame, and two jointed axes between the two side links and the two connecting rods are in the two curved grooves respectively.

In an example, the upper surface of the second cabinet is provided with a straight groove at the perpendicular bisector position of the frame, and a jointed axis between the two connecting rods is in the straight groove.

In an example, the two curved grooves are two parabolic shapes of a set of opposite sides defining openings respectively facing the direction perpendicular to the direction in which the second cabinet moves, and a distance from an end point of the parabolic curves close to the push-pull end of the second cabinet to the push-pull end and a distance from the other end of the parabolic curves to the end of the second cabinet opposite to the push-pull end are equal to the length of the side links.

In an example, a distance between the two end points respectively at the symmetric positions of the two parabolic curves is less than a sum of the lengths of the two connecting rods.

In an example, a side of the first cabinet opposite to the second cabinet is further provided with a first recess, and when the two jointed axes between the two side links and the two connecting rods move to the position corresponding to the first cabinet, at least the jointed axes are in the first recess.

In an example, a side of the first cabinet opposite to the second cabinet is further provided with a second recess, and when the jointed axis between the two connecting rods moves to the position corresponding to the first cabinet, at least the jointed axis is in the second recess.

In an example, the locking mechanism comprises: a latch and a latch mate configured to fix relative positions of the first cabinet and the second cabinet, and an elastomer configured to fix the relative position of the adjusting lever, wherein an end of the elastomer is connected with the push-pull end of the first cabinet, and the other end of the elastomer is connected with the adjusting lever.

In an example, in the direction perpendicular to the direction in which the second cabinet moves, a side surface of the first cabinet is outside a side surface of the second cabinet; wherein the latch mate is: a plurality of locating holes on the side surface of the second cabinet, wherein the latch assembly comprises a latch button, a buckle with a rotary axis, a spring; wherein, the latch button is provided with a catch slot; the spring is sheathed on the latch button, and one end of the spring is in contact with the sidewall of the first cabinet, the other end of the spring is connected with the latch button; a first end of the buckle is jammed into the catch slot, and the buckle is rotatable around the rotary axis, and the rotary axis is fixed to the sidewall of the first cabinet; when the latch button is in an initial state, a second end of the buckle is jammed into the locating holes; when the latch button is in a pressed state, the spring is compressed and the catch slot produces a displacement and drives the buckle to rotate around the rotary axis so that the second end of the buckle exits the locating hole; when the latch button is in a rebounded state, the spring is rebounded and drives the latch button back to the initial state.

BRIEF DESCRIPTION OF THE DRAWINGS

To describe the technical solutions in the embodiments of this disclosure or the prior art more clearly, the accompanying drawings used in the embodiments or the prior art are briefly introduced in the following. Evidently, the accompanying drawings in the following description are only some embodiments of this disclosure, and persons of ordinary skill in the art may also obtain other drawings according to these accompanying drawings without creative efforts.

FIG. 3b is a schematic diagram showing a side surface structure of the second cabinet shown in FIG. 3a;

DETAILED DESCRIPTION

The technical solutions in the embodiments of this disclosure are clearly and completely described in the following with reference to the accompanying drawings in the embodiments of this disclosure. Evidently, the embodiments in the following description are only a part rather than all of the embodiments of this disclosure. Based on the embodiments in this disclosure, all other embodiments obtained by persons of ordinary skill in the art without creative effects shall fall within the protection scope of this disclosure.

Embodiments of this disclosure provide a flexible display device, which, through the coordination of the various mechanisms, can achieve adjustment of a size of an actual display screen.

Figure 1:
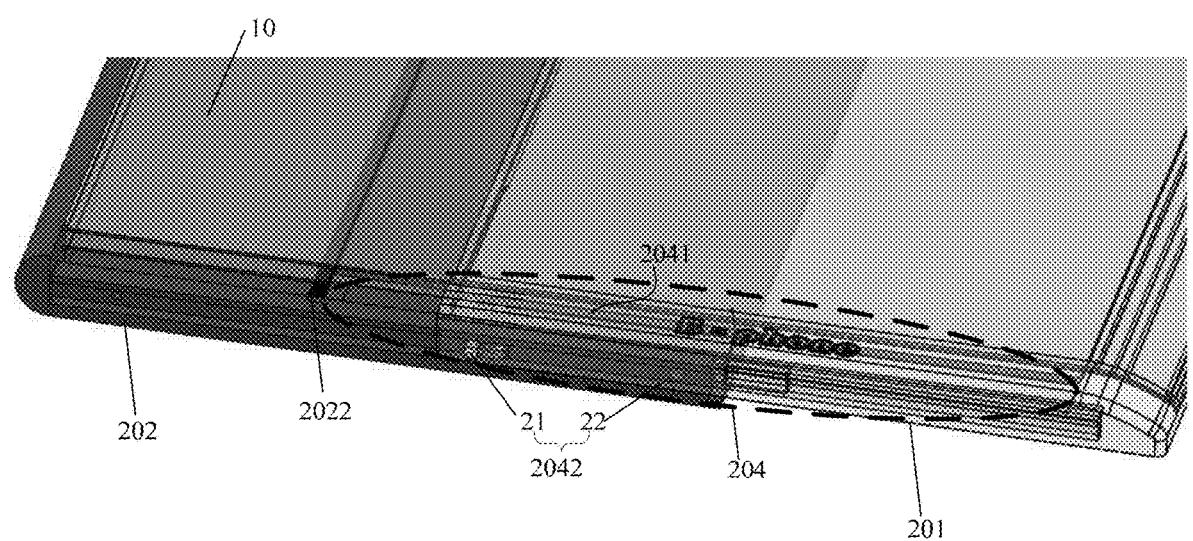
FIG. 1 is a schematic diagram showing a structure of a flexible display device provided according to an embodiment of this disclosure.
Figure 2:
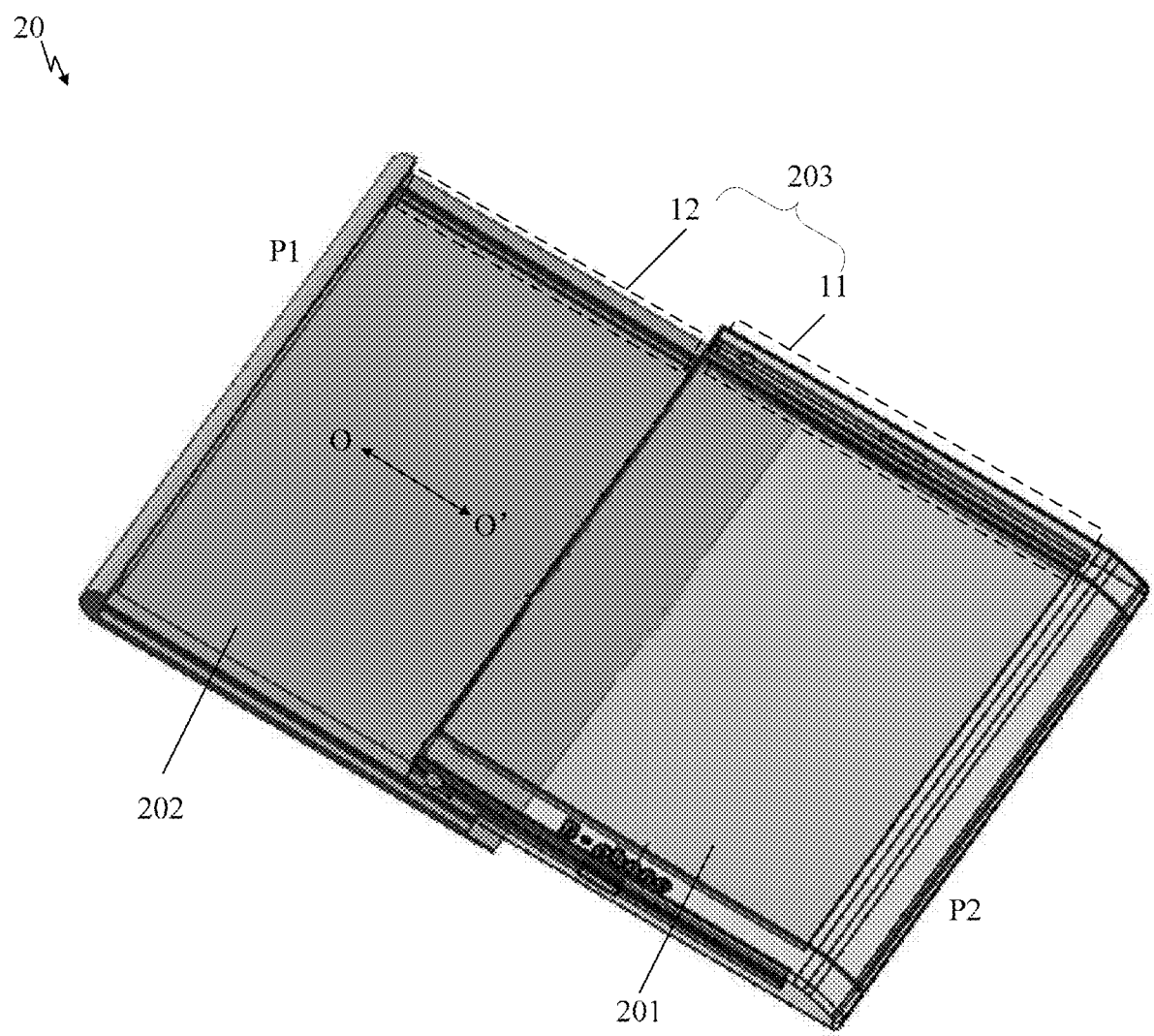
FIG. 2 is a schematic diagram showing a structure of a folding mechanism in a flexible display device provided according to an embodiment of this disclosure.

Specifically, an embodiment of this disclosure provides a flexible display device, as shown in FIG. 1 and FIG. 2, comprising a bendable flexible display panel 10 and a folding mechanism 20. The folding mechanism 20 comprises a first cabinet 201 and a second cabinet 202 overlapping each other, and a guiding mechanism 203, wherein the second cabinet 202 is able to move in a straight line direction (O-O') relative to the first cabinet 201 through the guiding mechanism 203 (see FIG. 2).

Those skilled in the art would appreciate that, as a folding mechanism, the first cabinet 201 makes a linear motion relative to the second cabinet 202, then as shown in FIG. 2, two non-overlapping ends P1 and P2 of the first cabinet 201 and the second cabinet 202 may be regarded as two opposite push-pull ends of the flexible display device, to ensure that the second cabinet 202 is able to in a straight line direction (O-O') relative to the first cabinet 201 through the guiding mechanism 203.

In addition, the flexible display device further comprises a guiding portion 2021 and an adjusting lever 2022 in the second cabinet 202 (see FIG. 3), and a locking mechanism 204 (see FIG. 1)

Figure 3A:
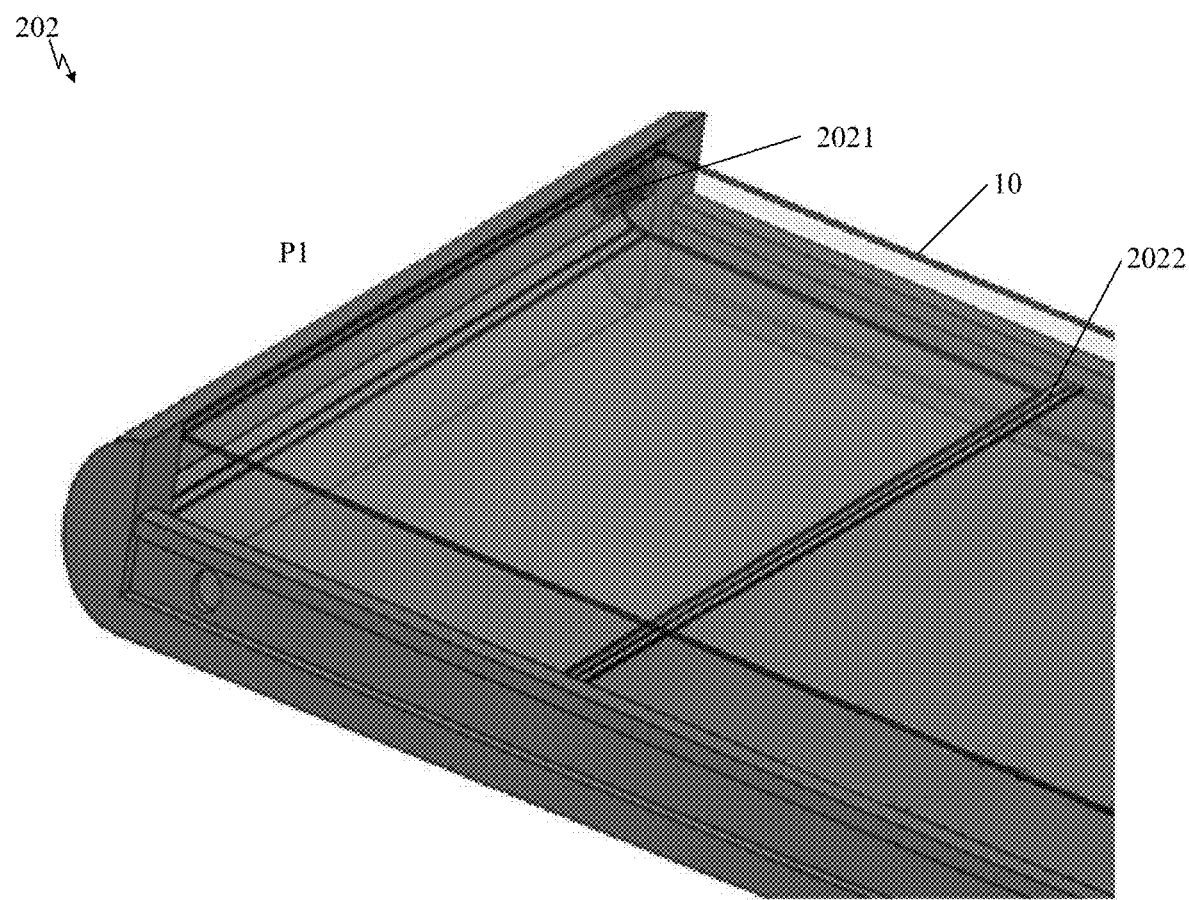
FIG. 3a is a schematic diagram showing a structure of a second cabinet in a flexible display device provided according to an embodiment of this disclosure.
Figure 3B:
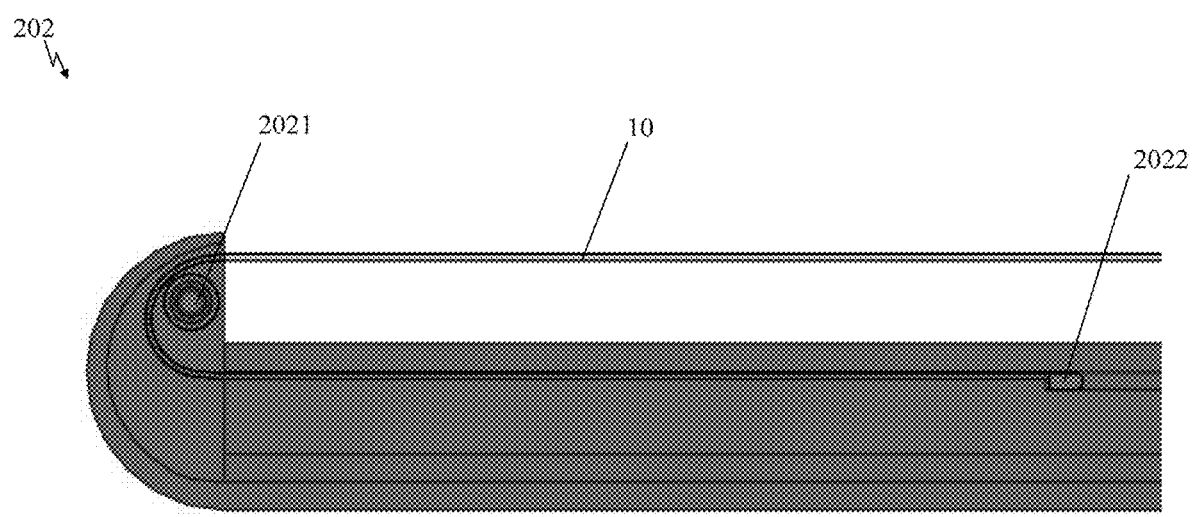

Specifically, as shown in FIG. 3a and FIG. 3b, the guiding portion 2021 is at the push-pull end P1 of the second cabinet 202, and the adjusting lever 2022 is able to between the push-pull end P1 and an end opposite to the push-pull end P1 (see FIG. 2). Specifically, a rail is provided between the push-pull end P1 and the end opposite to the push-pull end P1 to guarantee normal movement of the adjusting lever 2022; an end of the flexible display panel 10 is fixed to the push-pull end P2 of the first cabinet 201 (see FIG. 1), and the other end of the flexible display panel 10 wraps around the guiding portion 2021 and is fixed to the adjusting lever 2022 in an opposite direction (see FIG. 3*a* and FIG. 3*b*).

The guiding portion 2021 is generally a guiding pivot to reduce frictions between the guiding portion 2021 and the flexible display panel 10, thus avoiding damage to the flexible display panel 10.

The locking mechanism 204 is configured to fix the relative positions of the first cabinet 201, the second cabinet 202 and the adjusting lever 2022.

On one hand, the flexible display device enables the second cabinet to move in the straight line direction relative to the first cabinet through the guiding mechanism in the folding mechanism, and adjust the size of the flexible display panel for actual screen display under the relative motion of the cabinets; on the other hand, in case where the size is adjusted to an actually required size, the locking mechanism is configured to fix the relative positions of the first cabinet, the second cabinet and the adjusting lever, thereby fixing a size for the actual screen display. In other words, the flexible display device in this disclosure can realize the adjustment of the size of the actual display screen through the cooperation of the various mechanisms, thus satisfying users' various demands on the flexible display device and improving the user's experience.

It should be noted that, by assuming that a side close to the user's actual observation as the upper side of the flexible display device, then, in this disclosure, the upper and lower relationship of the overlapping first cabinet 201 and the second cabinet 202 is not specifically defined, and it can be that the first cabinet 201 is above the second cabinet 202 (see FIG. 2); or it can that the first cabinet 201 is below the second cabinet 202, as long as when the second cabinet 202 moves relative to the first cabinet 201 through the guiding mechanism 203 along the straight line direction (O-O'), the size adjustment for actual display of the flexible display panel 10 can be made, but this is not limited in this disclosure.

However, since in this disclosure, the guiding portion 2021 and the adjusting lever 2022 both are in the second cabinet 202, that is, the second cabinet 202 serves as an active adjusting cabinet, and the first cabinet 201 can be a fixed cabinet or a movable cabinet; on this basis, if the first cabinet 201 is below the second cabinet 202, the positions of the flexible display panel 10 corresponding to the first cabinet 201 and the second cabinet 202 are in a suspended state, which makes the whole display device have a low reliability and durability. Therefore, in a specific example of this disclosure, the first cabinet 201 is above the second cabinet 202, and the upper surface of the first cabinet 201 is in fixed contact with the corresponding position of the flexible display panel 10, thereby improving reliability, stability and etc. of the entire display device. The following embodiments further describe this disclosure based on the fact that the first cabinet 201 is above the second cabinet 202.

The specific configuration of the guiding mechanism 203 is explained described in the following through specific embodiments.

Figure 4:
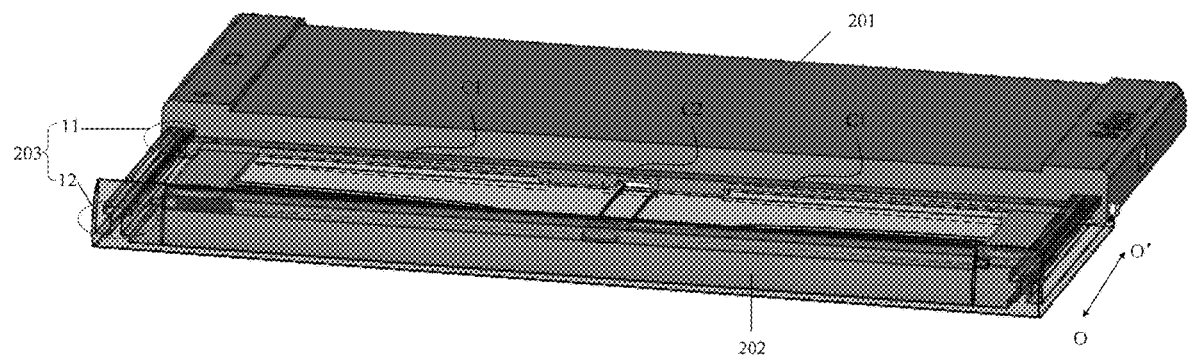
FIG. 4 is a schematic diagram showing a partial structure of a flexible display device provided according to an embodiment of this disclosure.

In some embodiments, as shown in FIG. 2 and FIG. 4, the guiding mechanism 203 may comprise: at least a set of guide groove 11 and guide rail 12 on opposite sides of the first cabinet 201 and the second cabinet 202 respectively, and the guide groove 11 and guide rail 12 are arranged to face each other.

It should be noted that, the set of guide groove 11 and guide rail 12, can be as shown in FIG. 4, wherein the guide groove 11 is in the first cabinet 201, and the guide rail 12 is in a position of the second cabinet 202 corresponding to the guide groove 11; or wherein the guide rail 12 is the first cabinet 201, and the guide groove 11 is in a position of the second cabinet 202 corresponding to the guide rail 12, and this is not limited in this disclosure. Of course, in order to ensure that, in the normal use of the flexible display device, an opening of the guide groove 11 faces down to avoid outside debris from falling into the groove, in an example of this disclosure, as shown in FIG. 4, the guiding groove 11 is in the first cabinet 201, and the guide rail 12 is in a position of the second cabinet 202 corresponding to the guide groove 11.

In addition, in order to ensure that the second cabinet 202 is able to relative to the first cabinet 201 along the straight line direction (O-O') in a more balanced and stable manner, as shown in FIG. 4, in an example of this disclosure, the guiding mechanism 203 comprises two sets of guide grooves 11 and guide rails 12, and the two sets of guide grooves 11 and guide rails 12 are at two edges of a set of opposite sides of the first cabinet 201 and the second cabinet 202 facing each other in a direction perpendicular to the direction in which the second cabinet moves (i.e., a direction perpendicular to O-O') respectively.

Figure 5:
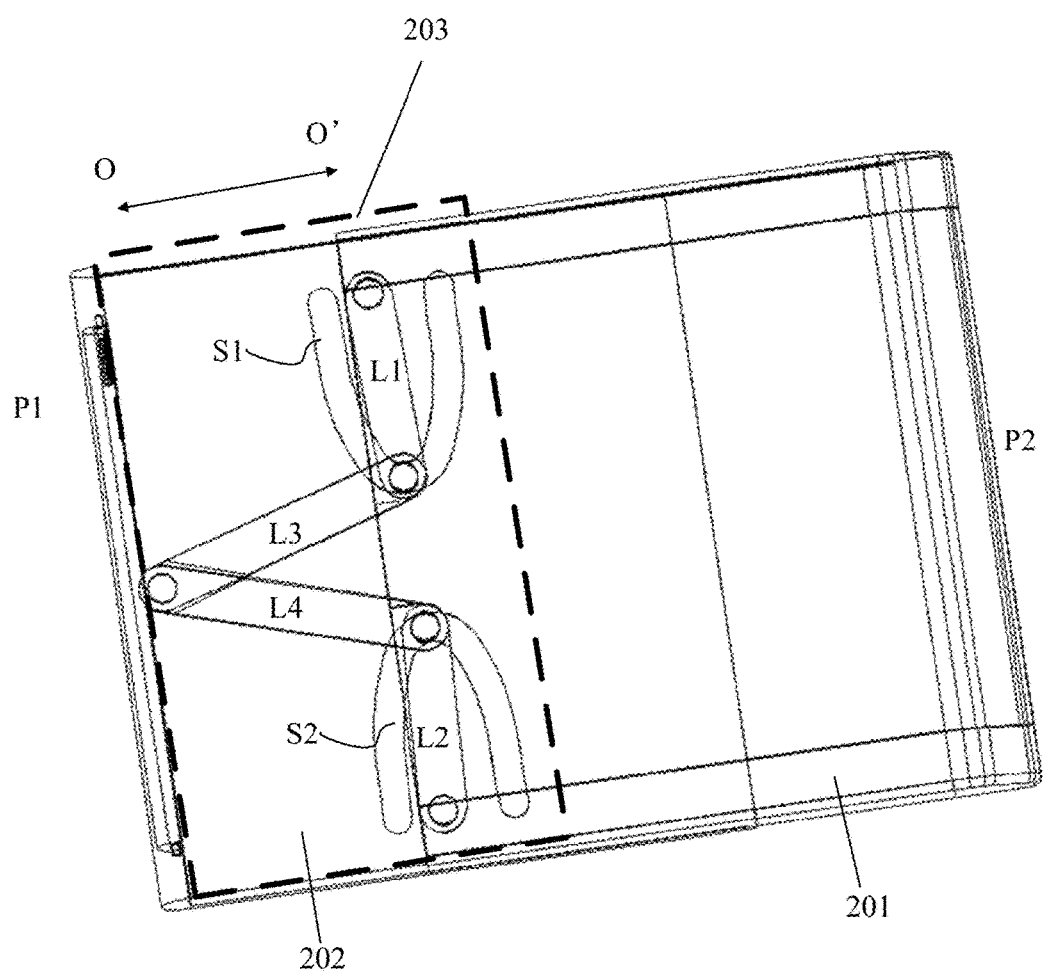
FIG. 5 is a schematic diagram showing a partial structure of another flexible display device provided according to an embodiment of this disclosure.

In some other embodiments, as shown in FIG. 5, the guiding mechanism 203 comprises: a hinged five-bar mechanism between opposite sides of the first cabinet 201 and the second cabinet 202, wherein the hinged five-bar mechanism comprises a frame, two side links (L1 and L2) and two connecting rods (L3 and L4), and the five members are connected end-to-end to form a closed kinematic chain, wherein the closed kinematic chain is symmetrical with respect to a perpendicular bisector of the frame, that is, the two side links have the same size and the two connecting rods have the same size; wherein an end of the first cabinet 201 opposite to the push-pull end P2 forms the frame, that is, the end of the first cabinet 201 opposite to the push-pull end P2 and in a direction perpendicular to the direction in which the second cabinet moves (i.e., a direction perpendicular to O-O'), as a whole, forms the frame.

Figure 6:
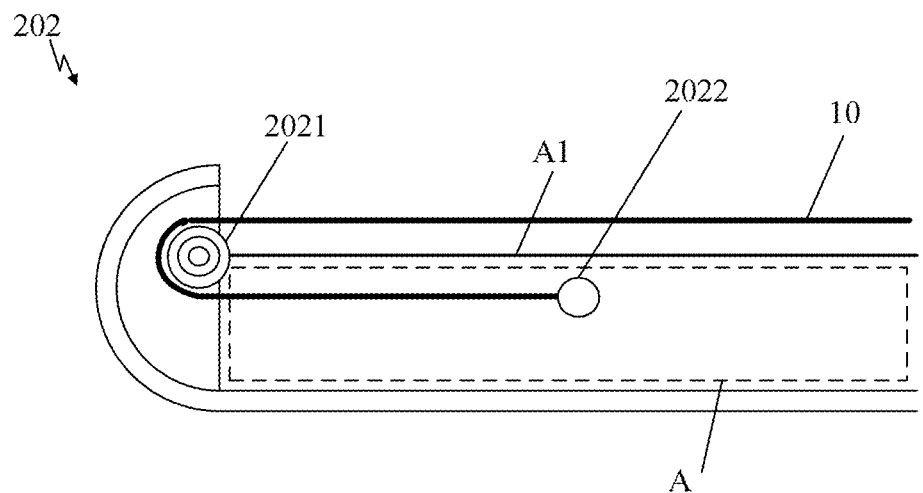
FIG. 6 is a schematic diagram showing a side surface structure of a second cabinet in another flexible display device provided according to an embodiment of this disclosure.

Further, as shown in FIG. 6, the second cabinet 202 has a cavity structure A, wherein the adjusting lever 2022 is in the cavity structure, that is, through the adjustment of the adjusting lever 2022, the flexible display panel 10 can be partially hidden in the cavity structure A, and a lower surface of the guiding portion 2021 is approximately in the same horizontal plane as the adjusting lever 2022, to guarantee normal size adjustment of the flexible display panel 10.

In addition, in order to ensure that the second cabinet 202 is able to relative to the first cabinet 201 through the guiding mechanism 203 along the straight line direction (O-O'), the upper surface A1 of the second cabinet 202 is provided with grooves (see in combination with FIG. 5 and FIG. 6).

Specifically, as shown in FIG. 5, the grooves can be two curved grooves (S1 and S2) on the upper surface A1 of the second cabinet 202, and the two curved grooves (S1 and S2) are symmetrical with respect to the perpendicular bisector of the frame, and two jointed axes between the two side links (L1 and L2) and the two connecting rods (L3 and L4) are in the two curved grooves (S1 and S2) respectively, to ensure that the second cabinet 202 is able to relative to the first cabinet 201 along the straight line direction (O-O').

Figure 7:
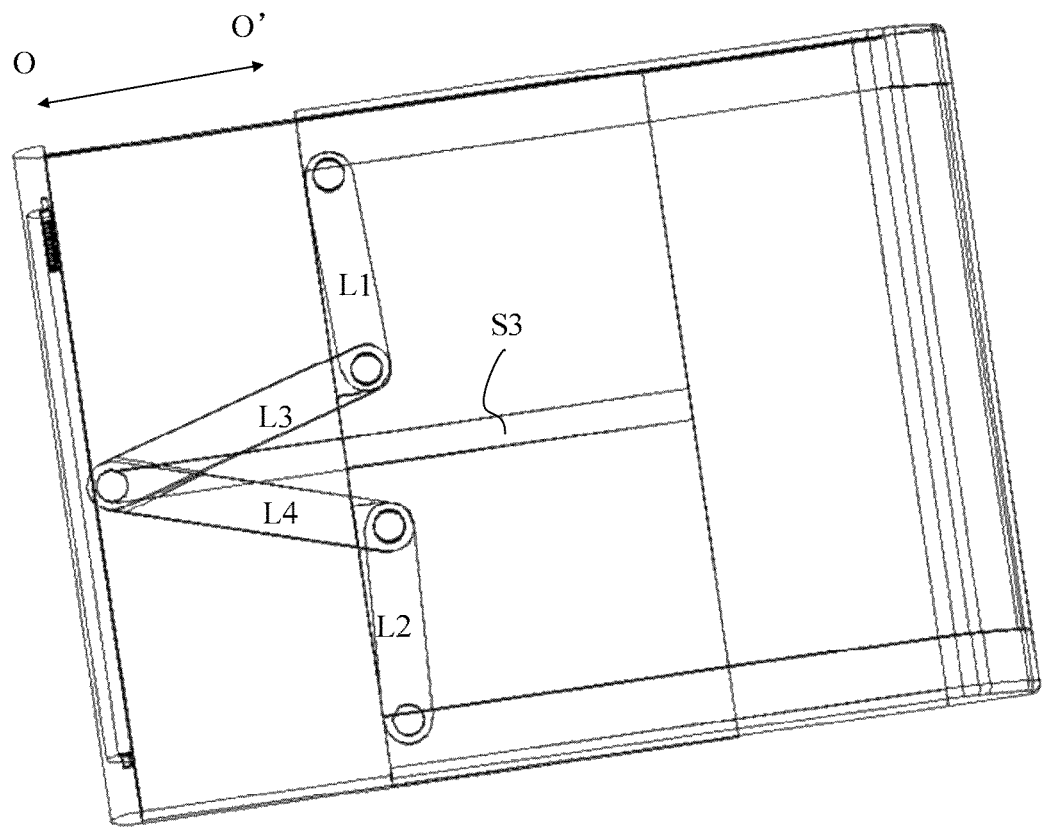
FIG. 7 is a schematic diagram showing a partial structure of another flexible display device provided according to an embodiment of this disclosure.

In addition, as shown in FIG. 7, the groove can be a straight groove S3 on the upper surface A1 of the second cabinet 202, and the straight groove S3 is at the perpendicular bisector position of the frame, and the jointed axis between the two connecting rods (L3 and L4) is in the straight groove S3, to ensure that the second cabinet 202 is able to relative to the first cabinet 201 along the straight line direction (O-O').

Figure 8:
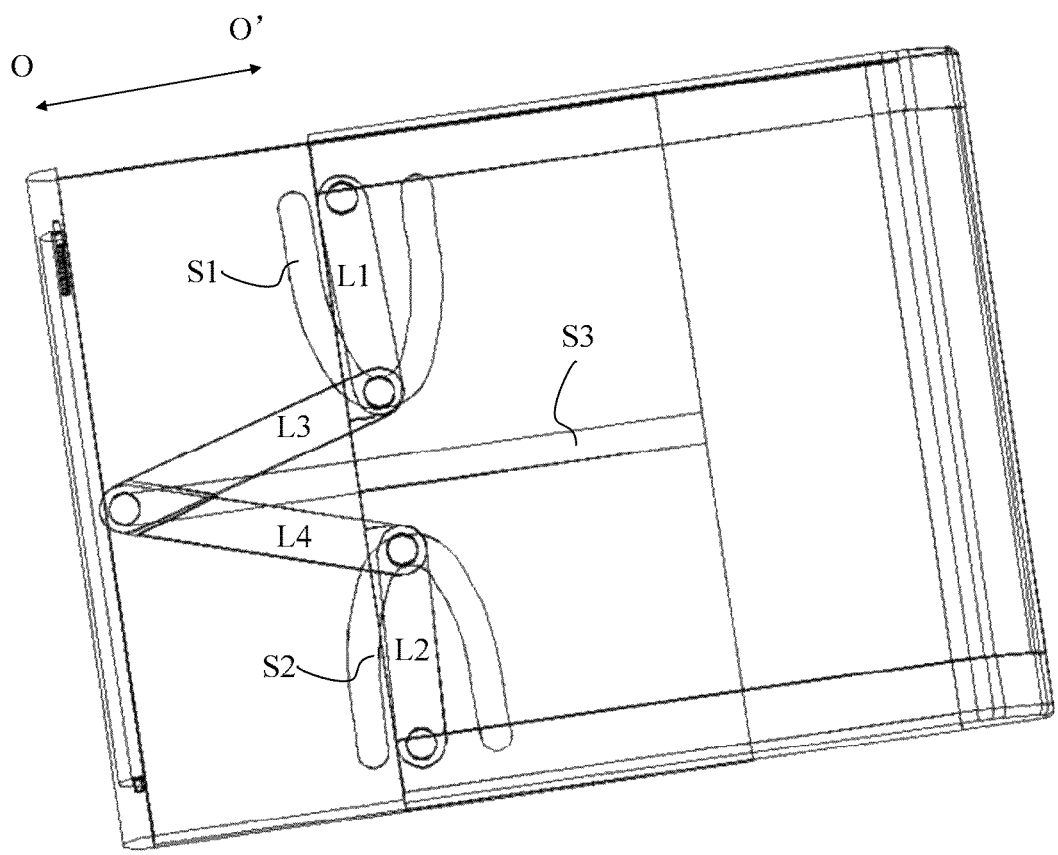
FIG. 8 is a schematic diagram showing a partial structure of another flexible display device provided according to an embodiment of this disclosure.

Of course, in order to improve stability of the entire folding mechanism 20 so that the second cabinet 202 is able to relative to the first cabinet 201 along the straight line direction (O-O') in a stable and smooth manner, in an example of this disclosure, as shown in FIG. 8, the upper surface A1 of the second cabinet 202 is provided with both the two curved grooves (S1 and S2) as well as the straight groove S3.

Figure 9:
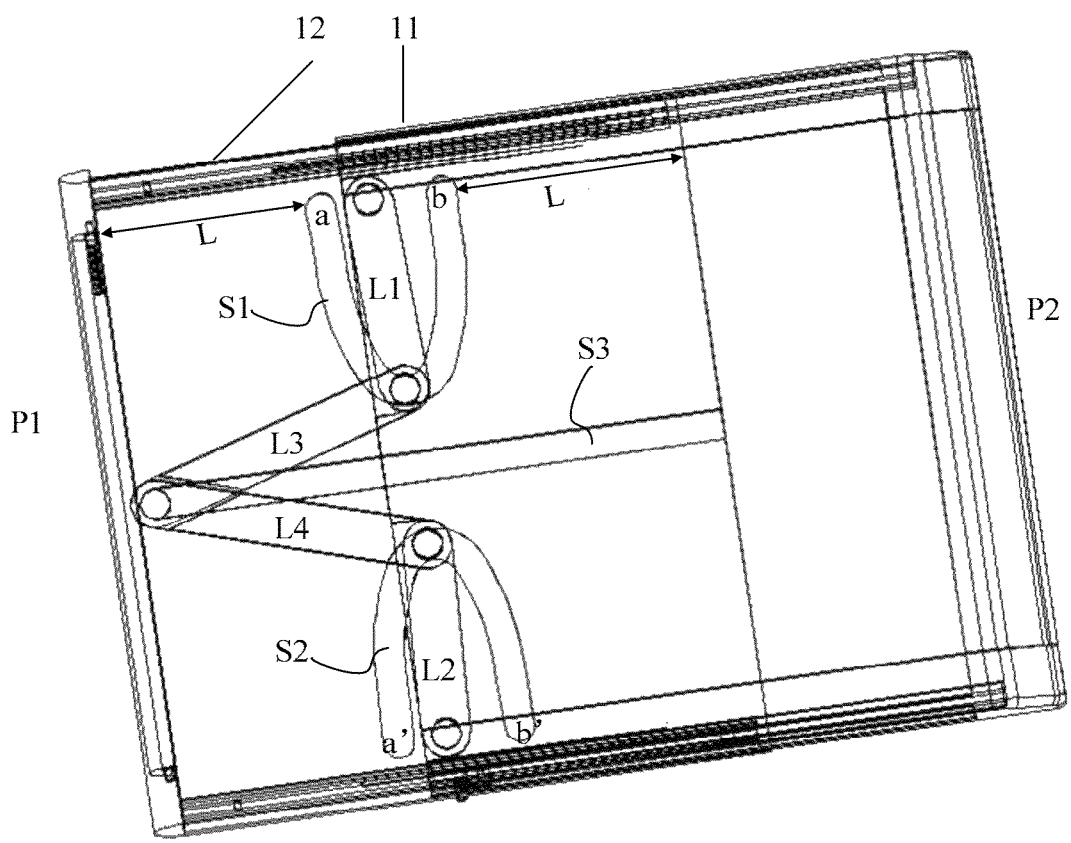
FIG. 9 is a schematic diagram showing a partial structure of a further flexible display device provided according to an embodiment of this disclosure.

In some other embodiments, in order to further improve the stability of the entire folding mechanism 20 so that the second cabinet 202 is able to relative to the first cabinet 201 along the straight line direction (O-O') in a stable and smooth manner, in an example of this disclosure, as shown in FIG. 9, the guiding mechanism 203 may comprise: two sets of guide grooves 11 and guide rails 12 at two edges of a set of opposite sides of the first cabinet 201 and the second cabinet 202 facing each other in a direction perpendicular to the direction in which the second cabinet moves (i.e., a direction perpendicular to O-O') respectively, as well as a hinged five-bar mechanism and a groove structure (two curved grooves and a straight curve) between opposite sides of the first cabinet 201 and the second cabinet 202.

The following is a further explanation of the setting of the hinged five-bar mechanism and the groove structure in the above embodiment.

As shown in FIG. 9, the two curved grooves (S1 and S2) are of the shapes of two parabolic curve with a set of opposite sides defining openings respectively facing the direction perpendicular to the direction in which the second cabinet moves (i.e., a direction perpendicular to O-O'), and a distance L from an end point a of the parabolic curve close to the push-pull end P1 of the second cabinet 202 to the push-pull end P1 and a distance L from the other end b of the parabolic curve to the end opposite to the push-pull end P1 are equal to the length (L1 and L2) of the side links (with reference to FIG. 10 and FIG. 11a), to ensure that the second cabinet 202 is able to in a largest distance range relative to the first cabinet 201 along the straight line direction (O-O').

Figure 10:
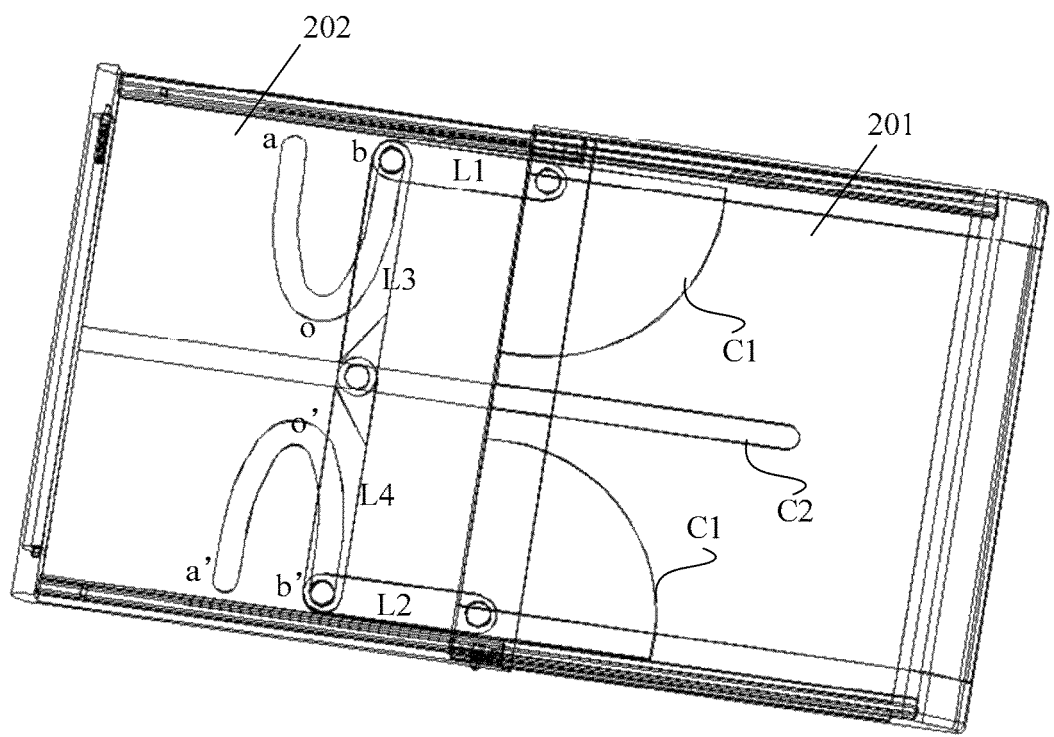
FIG. 10 is a schematic diagram showing a partial structure of a further flexible display device provided according to an embodiment of this disclosure.
Figure 11A:
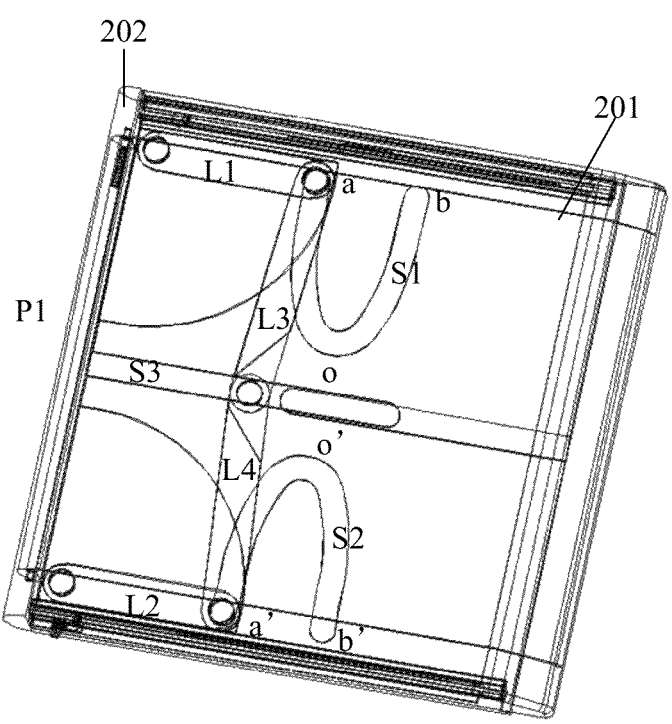
FIG. 11a is a schematic diagram showing a structure of a flexible display device provided according to an embodiment of this disclosure, in which two cabinets are in a certain relative position.

In addition, in order to avoid that in the movement of the hinged five-bar mechanism, the two connecting rods (L3 and L4) are in the same line, resulting in the occurrence of a self-locking phenomenon in the entire mechanism, in an example of this disclosure, as shown in FIG. 10 or FIG. 11a, a distance between the two end points (i.e., the end point a to the end point a', and the end point b to the end point b') respectively at the symmetric positions of the two parabolic curves is less than a sum of the lengths of the two connecting rods (L3 and L4); in this way, even if the two jointed axes between the two side links (L1 and L2) and the two connecting rods (L3 and L4) are respectively moved to the two end points (the end point a to the end point a', or the end point b to the end point b') at the symmetric positions of the two parabolic curves, the two connecting rods (L3 and L4) will not be in the same line, thereby avoiding the occurrence of the self-locking phenomenon.

In addition, in order to ensure that, when the moving jointed axis in the hinged five-bar mechanism moves to the position corresponding to the first cabinet, it can be better hidden on a side of the first cabinet 201 opposite to the second cabinet 202, in combination with FIG. 10 and FIG. 4, in an example, a side of the first cabinet 201 opposite to the second cabinet 202 is provided with a first recess C1 and/or a second recess C2.

Specifically, when the two jointed axes between the two side links (L1 and L2) and two connecting rods (L3 and L4) move to a position corresponding to the first cabinet 201, at least the two jointed axes are in the first recess C1; and/or when the jointed axis between two side links (L3 and L4) moves to the position corresponding to the first cabinet 201, at least the jointed axis is in the second recess C2.

An actual movement of the second cabinet 202 relative to the first cabinet 201 through the guiding mechanism 203 along the straight linear direction (O-O') is further described in the following according to specific illustrations.

In the case where the fully overlapping position of the first cabinet 201 and the second cabinet 202 shown in FIG. 11a is the initial position, at this time, the two jointed axes between the two side links (L1 and L2) and two connecting rods (L3 and L4) are respectively in two end points (the end point a and the end point a') of the symmetrical positions of two curved grooves (S1 and S2) close to the push-pull end P1 of the second cabinet 202, an angle between the two side links (L3 and L4) is close to but not equal to 180° (avoiding self-locking, as mentioned above); in this case, an overlapping area between the second cabinet 202 and the first cabinet 201 is the largest, and a size for actual display of the flexible display panel in the flexible display device is the smallest.

Figure 11B:
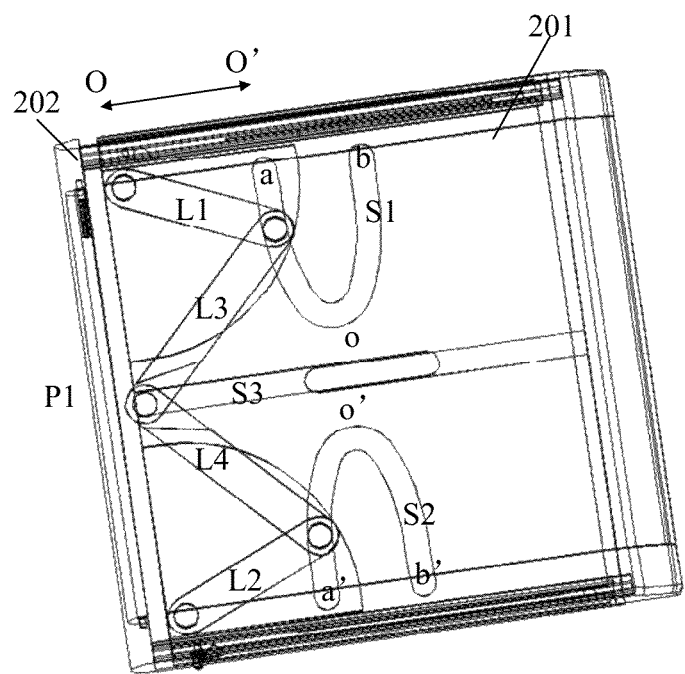
FIG. 11b is a schematic diagram showing a structure of a flexible display device provided according to an embodiment of this disclosure, in which two cabinets are in a certain relative position.

Next, pull the second cabinet 202 away from the first cabinet 201 through the push-pull end P1 of the second cabinet 202 along the straight line direction (O-O'), and as shown in FIG. 11b, the two jointed axes between two side links (L1 and L2) and two connecting rods (L3 and L4) move along the two curved grooves (S1 and S2) away from the end points a and end a' (i.e., towards curved vertices o and o'), the angle between the two connecting rods (L3 and L4) decreases, and the jointed axis between the two connecting rods (L3 and L4) moves along the straight groove S3 in a direction close to the push-pull end P1 of the second cabinet 202; at this time, the flexible display panel hidden in the cavity structure A is gradually expanded to increase the size of the flexible display panel for actual display.

Figure 11C:
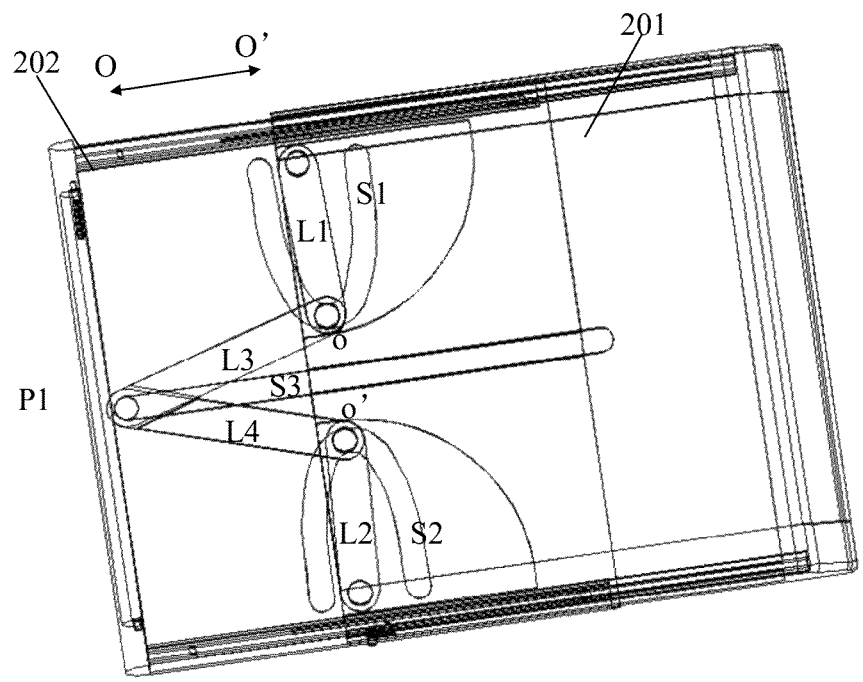
FIG. 11c is a schematic diagram showing a structure of a flexible display device provided according to an embodiment of this disclosure, in which two cabinets are in a certain relative position.

Continue to pull the second cabinet 202, and as shown in FIG. 11c, the two jointed axes between two side links (L1 and L2) and two connecting rods (L3 and L4) move to the curved vertices (o and o') of the two curved grooves (S1 and S2); at this time, the flexible display panel hidden in the cavity structure A is gradually expanded to increase the size of the flexible display panel for actual display.

Figure 11D:
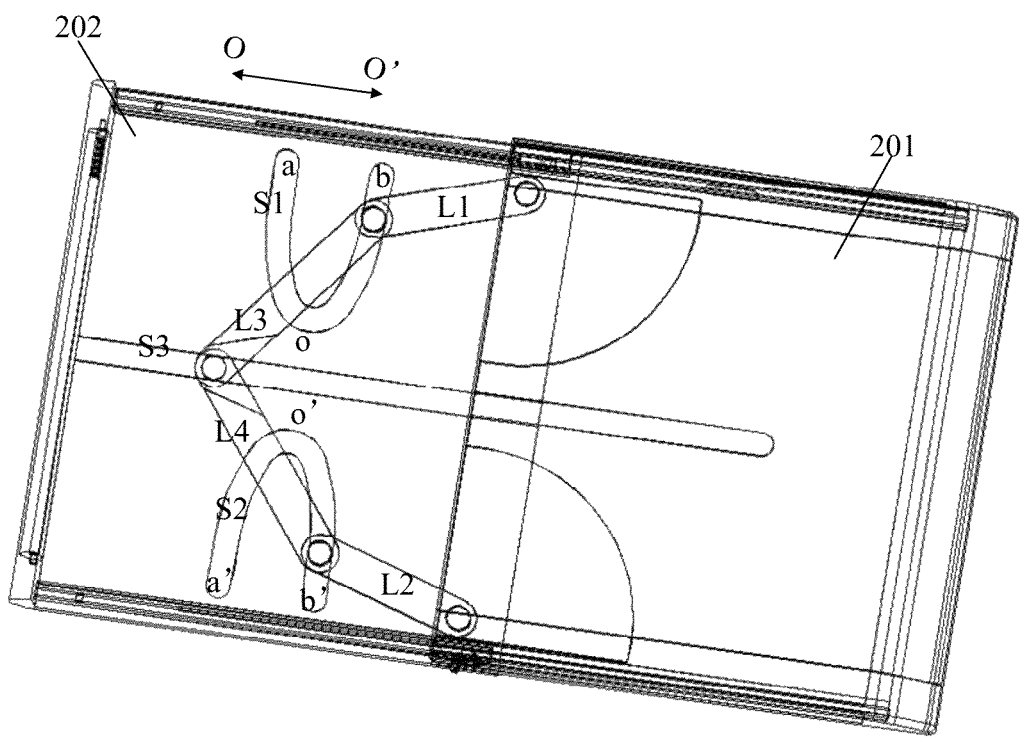
FIG. 11d is a schematic diagram showing a structure of a flexible display device provided according to an embodiment of this disclosure, in which two cabinets are in a certain relative position.

Continue to pull the second cabinet 202, as shown in FIG. 11d, the two jointed axes between the two side links (L1 and L2) and two connecting rods (L3 and L4) move along two curved grooves (S1 and S2) in a direction close to the end point b and the end point b' (i.e. away from the curved vertices o and o'), and the angle between the two connecting rods (L3 and L4) increases; at this time, the flexible display panel hidden in the cavity structure A is gradually expanded to increase the size of the flexible display panel for actual display.

Continue to pull the second cabinet 202 until as shown in FIG. 10, and when the two jointed axes between two side links (L1 and L2) and two connecting rods (L3 and L4) move to two end points (the end point b and the end point b') of the symmetrical positions of the two curved grooves (S1 and S2) close to the end opposite to the push-pull end P1 of the second cabinet 202, the overlapping area between the second cabinet 202 and the first cabinet 201 is the smallest, and the size for actual display of the flexible display panel in the flexible display device is the largest.

Of course, the above is merely the illustration of the process of the folding mechanism 20 from the contracted state to the expanded state (FIG. 11a-FIG. 11b-FIG. 11c-FIG. 11d-FIG. 10), and the process of the folding mechanism 20 from the expanded state to the contracted state is opposite to the above process, i.e., FIG. 10-FIG. 11d-FIG. 11c-FIG. 11b-FIG. 11a, and thus is omitted here.

It should be noted here that, the flexible display panel is not shown in the process, but in combination with the above description and figures (for example, FIG. 6), those skilled in the art would appreciate that, while pushing and pulling the second cabinet 202, the guiding portion 2021 and the adjusting lever 2022 (FIG. 3) in the second cabinet 202 simultaneously move, and in combination with the locking mechanism 204 (FIG. 1), adjustment of the size of the flexible display panel for actual display can be realized.

The following is a further explanation of the specific configuration of the locking mechanism 204 in this disclosure.

As shown in FIG. 1, the locking mechanism 204 comprises: a latch assembly 2042 (including a latch and a latch mate) configured to fix the relative position of the first cabinet 201 and the second cabinet 202; and an elastomer 2041 configured to fix the relative position of the adjusting lever 2022, an end of the elastomer 2041 is connected with the push-pull end P2 of the first cabinet 201, and the other end of the elastomer 2041 is connected with the adjusting lever 2022. Generally speaking, the elastomer 2041 can choose a weak spring, and when a force for pulling the second cabinet 202 is greater than a tension of the elastomer 2041, the second cabinet 202 moves away from the first cabinet 201, and the size for actual display of the flexible display panel increases; when the second cabinet 202 is pushed to move close to the first cabinet 201, under a contraction force of the elastomer 2041, the adjusting lever 2022 is driven to move close to the push-pull end P2 of the first cabinet 201, so that the flexible display panel can be rebounded smoothly and reliably, thereby reducing the size for actual display of the flexible display panel.

In addition, the latch assembly 2042 including the latch 21 and the latch mate 22 is specifically configured as follows: the latch 21 can be a screw, and the latch assembly 2042 can be multiple threaded locating holes correspondingly disposed on the sides of the first cabinet 201 and the second cabinet 202 in a direction perpendicular to the direction in which the first and second cabinet move (i.e., a direction perpendicular to O-O'); in this way, when the second cabinet 202 moves to the desired position, the screw and the threaded locating hole mate, thereby fixing the relative position between the first cabinet 201 and the second cabinet 202.

In order to improve the automated control of the flexible display device, this disclosure further provides a configuration of another latch assembly 2042. In particular, in a direction perpendicular to the direction in which the first and second cabinet move (i.e., a direction perpendicular to O-O'), in case where the side surface of the first cabinet 201 is outside the side surface of the second cabinet 202 (see FIG. 4), the latch mate 22 in the latch assembly 2042 is a plurality of locating holes on the side surface of the second cabinet 202 (see FIG. 1); the latch 21, as shown in FIG. 12a, includes a latch button 211, a buckle 212 with a rotary axis R, a spring 213; wherein the latch button 211 is provided with a catch slot 2111; the spring 213 is sheathed on the latch button 211, and one end of the spring 213 is in contact with a sidewall of the first cabinet 201, the other end of the spring 213 is connected with the latch button 211; a first end M of the buckle 212 is jammed into the catch slot 2111, and the buckle 212 is rotatable around the rotary axis R, and the rotary axis R is fixed to the sidewall of the first cabinet 201.

Figure 12A:
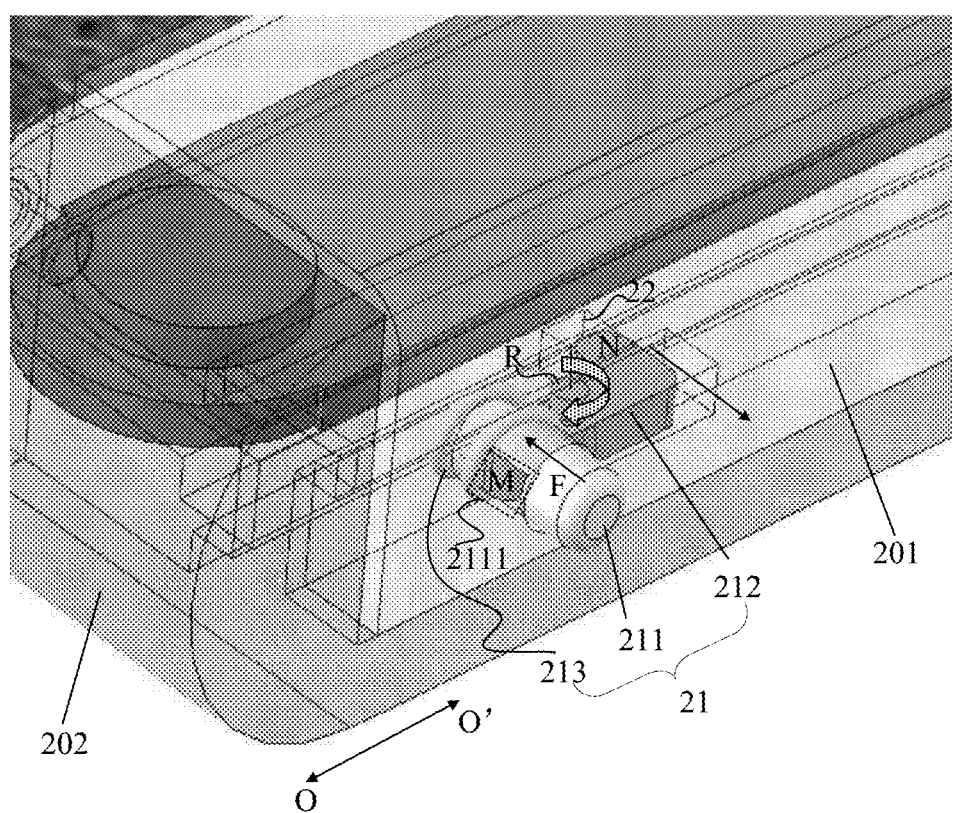
FIG. 12a is a schematic diagram showing a partial amplified structure of a flexible display device provided according to an embodiment of this disclosure.

Generally, in order to avoid the latch 21 form protruding the side surface of the cabinet too much, as shown in FIG. 12a, a recess can be provided on the first cabinet 201, and the latch 21 is embedded into the groove; of course, the first cabinet 201 is a through hole at least in a position corresponding to the second end N of the buckle 212, so as to be jammed into the locating holes (latch mate 22) through the second end N of the buckle 212 to locate the second cabinet 202.

Based on the above, the working state of the latch assembly 2042 is further explained in the following.

As shown in FIG. 12a, when the latch button 211 is in an initial state, the second end N of the buckle 212 is jammed into the locating holes (latch mate 22), and the first cabinet 201 and the second cabinet 202 are in a relatively fixed position.

Figure 12B:
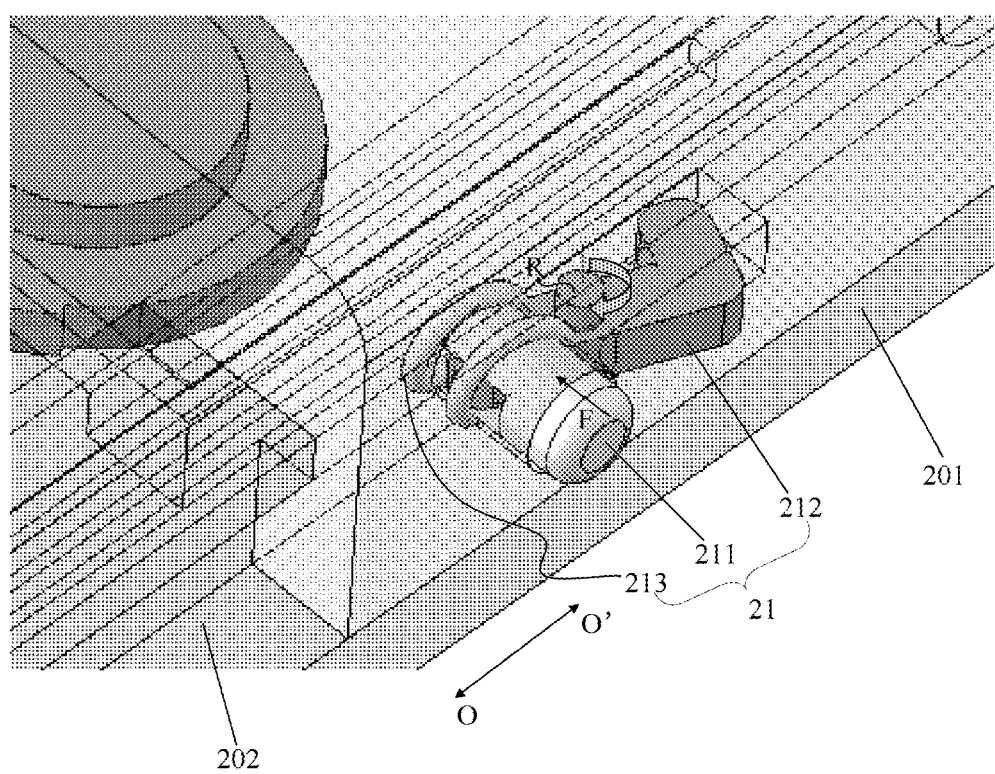
FIG. 12b is a schematic diagram showing a partial amplified structure of a flexible display device provided according to an embodiment of this disclosure.

When the latch button 211 is in a pressed state, as shown in FIG. 12b, the latch button 211 displaces in the pressed direction such that the spring 213 is compressed and the catch slot 2111 produces a displacement driven by the latch button 211; since the first end M of the buckle 212 is jammed into the catch slot 2111, when the catch slot 2111 displaces, the first end M of the buckle 212 follows the catch slot 2111 to move simultaneously, and drives the buckle 212 to rotate around the rotary axis R, so that the second end N of the buckle 212 exits the locating hole (latch mate 22); at this time, the second cabinet 202 can be moved to the corresponding position depending on the actually required size of the display screen.

When the latch button 211 is in a rebounded state, the spring 213 is rebounded and drives the latch button 211 back to the initial state; at this time, the second end N of the buckle 212 is jammed into the locating holes (latch mate 22) for locating.

Figure 13:
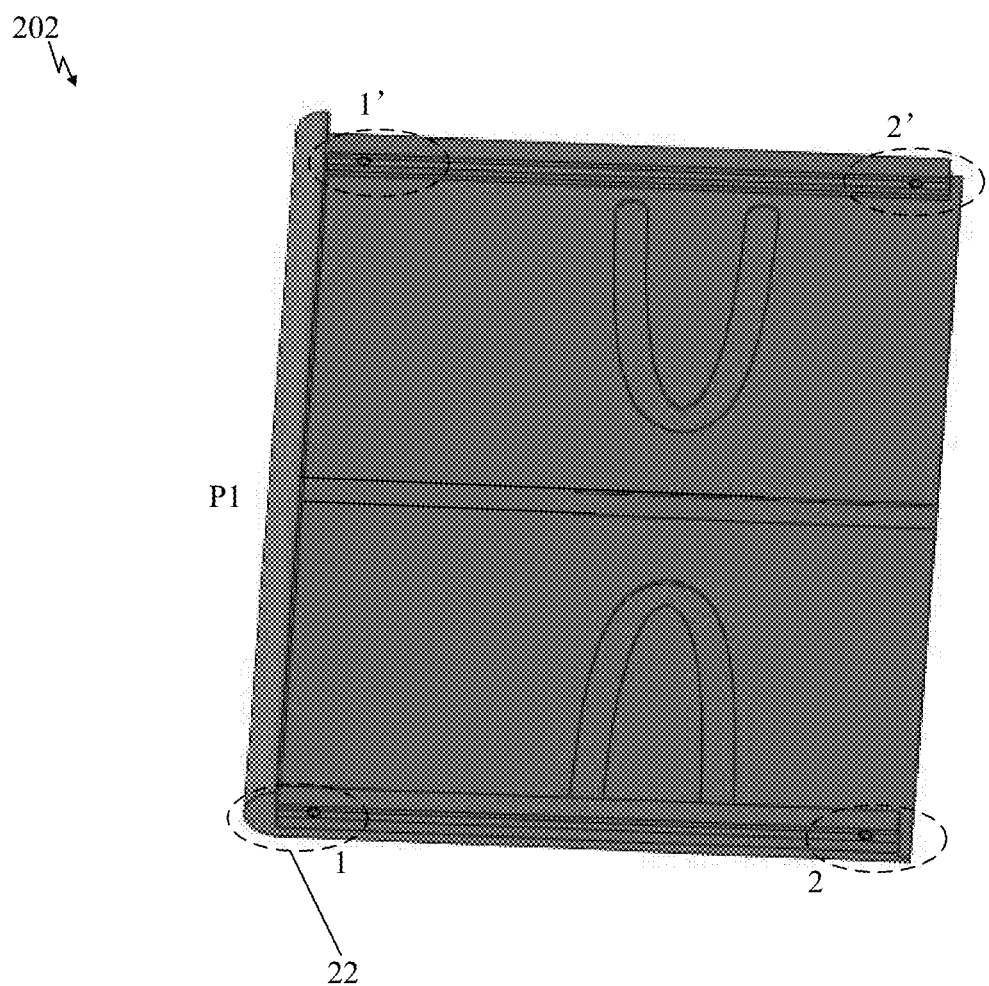
FIG. 13 is a schematic diagram showing a structure of a second cabinet in a flexible display device provided according to an embodiment of this disclosure.

In addition, for the setting of the locating hole (latch mate 22), it can be, as shown in FIG. 13, arranged in side limit positions of the second cabinet 202, that is, locating holes are respectively arranged in 1 and 1' positions of the push-pull end P1 of the second cabinet 202, as well as 2 and 2' positions of the end opposite to the push-pull end P1, thus the first cabinet 201 and the second cabinet 202 can be fixed in the two limit positions.

Figure 14:
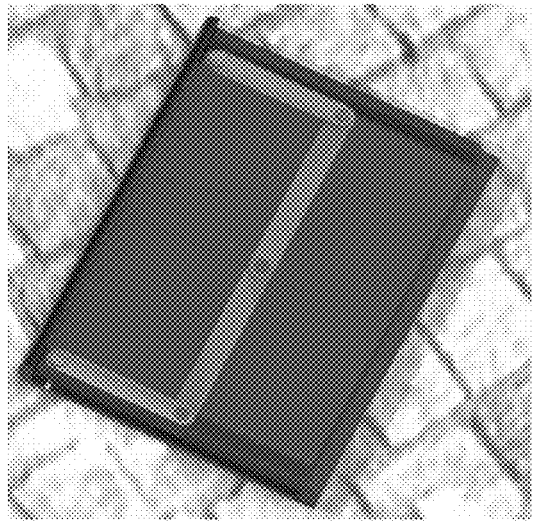
FIG. 14 is a schematic diagram showing a structure of a flexible display device in a fully folded state, provided according to an embodiment of this disclosure.
Figure 14:
Figure 15:
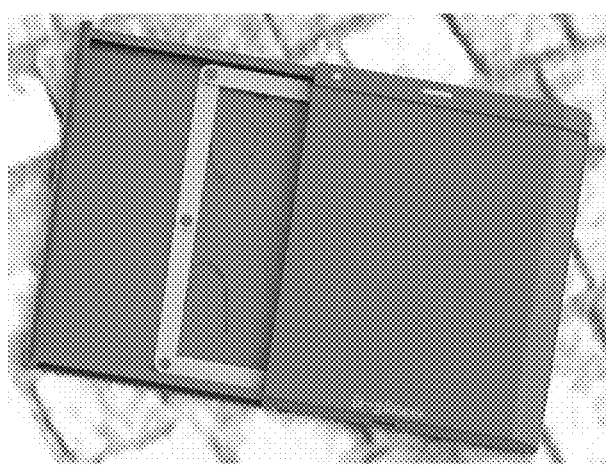
FIG. 15 is a schematic diagram showing a structure of a flexible display device in a fully expanded state, provided according to an embodiment of this disclosure.
Figure 15:
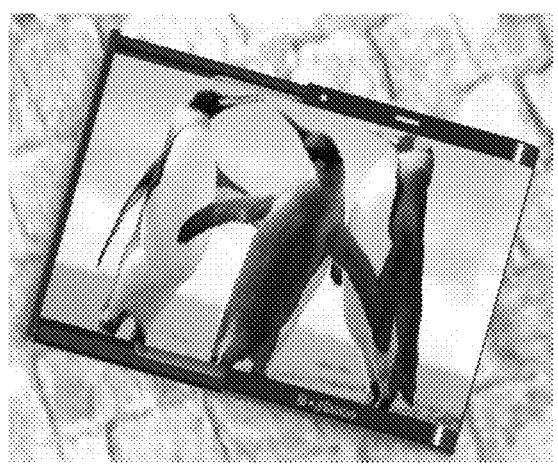

Specifically, the above two limit positions are: first, as shown in FIG. 14(a) (with the display screen not shown), the second end N of the buckle 212 is jammed into the locating holes in the 1 and 1' positions (see FIG. 13), and the first cabinet 201 and the second cabinet 202 fully overlap; at this time, as shown in FIG. 14 (b), the size of the actual display screen is the smallest; second, as shown in FIG. 15(a) (with the display screen not shown), the second end N of the buckle 212 is jammed into the locating holes in the 2 and 2' positions (see FIG. 13), and the second cabinet 202 is fully opened with respect to the first cabinet 201; at this time, as shown in FIG. 15(b), the size of the actual display screen is the largest.

A plurality of locating holes can also be arranged in fixed positions on the side surface of the second cabinet 202, depending on the actually required size of the plurality of fixed display screens, so as to realize the size adjustment of a plurality of scales of the display screen.

In addition, this disclosure, while realizing size adjustment of the actual display screen, by providing a sensing device to obtain the relative position of the first cabinet 201 and the second cabinet 202, according to the relative position of the first cabinet 201 and the second cabinet 202, can control the flexible display panel display in the display device to display a display picture consistent with the display screen size corresponding to the relative position, so as to further improve the applicability of the display device.

Those skilled in the art would appreciate that, all or part of the steps of the embodiments of the above method can be done through hardware related to program instructions, wherein the program can be stored in a computer readable storage medium, and, when being executed, can execute the steps of the aforementioned method embodiments; the storage medium includes: ROM, RAM, magnetic disk, or optical disc, or a variety of media that can store program code.

The above merely are embodiments of this disclosure, but the scope of protection of this disclosure is not limited to them. All modifications or substitutions readily occurring to persons of ordinary skill in the art are within the scope of protection of this disclosure. Therefore, the scope of protection of this disclosure shall be determined by the scope of protection of the claims.

What is claimed is:

1. A flexible display device comprising:
a flexible display panel; and
a folding mechanism, wherein the folding mechanism comprises a first cabinet and a second cabinet overlapping each other, and a guiding mechanism, wherein the second cabinet is able to move in a straight line direction relative to the first cabinet through the guiding mechanism;
wherein the flexible display device further comprises:
a guiding portion and an adjusting lever in the second cabinet, wherein the guiding portion is at a push-pull end of the second cabinet, the adjusting lever is able to move between the push-pull end and an end of the second cabinet opposite to the push-pull end, wherein an end of the flexible display panel is fixed to a push-pull end of the first cabinet, and the other end of the flexible display panel wraps around the guiding portion and is fixed to the adjusting lever in an opposite direction; and
a locking mechanism configured to fix relative positions of the first cabinet, the second cabinet and the adjusting lever,
wherein the guiding mechanism further comprises: a hinged five-bar mechanism between opposite sides of the first cabinet and the second cabinet, wherein the hinged five-bar mechanism comprises a frame, two side links and two connecting rods connected end-to-end to form a closed kinematic chain, wherein the closed kinematic chain is symmetrical with respect to a perpendicular bisector of the frame; the end of the first cabinet opposite to the push-pull end of the first cabinet forms the frame.

2. The flexible display device according to claim 1, wherein the first cabinet is above the second cabinet, and an upper surface of the first cabinet is in fixed contact with portions of the flexible display panel at corresponding locations.

3. The flexible display device according to claim 1, wherein the guiding mechanism comprises a first set of guide groove and guide rail on opposite sides of the first cabinet and the second cabinet respectively, and the guide groove and the guide rail are arranged to face each other.

4. The flexible display device according to claim 3, wherein the guiding mechanism further comprises a second set of guide groove and guide rail arranged to face each other, and the first set of guide groove and guide rail and the second set of guide groove and guide rail are at two edges of a set of opposite sides of the first cabinet and the second cabinet facing each other in a direction perpendicular to the direction in which the second cabinet moves, respectively.

5. The flexible display device according to claim 4, wherein the second cabinet has a cavity structure, wherein the adjusting lever is in the cavity structure, and a lower surface of the guiding portion is approximately in the same horizontal plane as the adjusting lever.

6. The flexible display device according to claim 5, wherein the upper surface of the second cabinet is provided with two curved grooves, and the two curved grooves are symmetrical with respect to the perpendicular bisector of the frame, and two jointed axes between the two side links and the two connecting rods are in the two curved grooves respectively.

7. The flexible display device according to claim 6, wherein the upper surface of the second cabinet is provided with a straight groove at the perpendicular bisector position of the frame, and a jointed axis between the two connecting rods is in the straight groove.

8. The flexible display device according to claim 7, wherein the two curved grooves are of the shapes of two parabolic curves with a set of opposite sides defining openings respectively facing the direction perpendicular to the direction in which the second cabinet moves, and a distance from an end point of the parabolic curves close to the push-pull end of the second cabinet to the push-pull end of the second cabinet and a distance from the other end of the parabolic curves to the end of the second cabinet opposite to the push-pull end of the second cabinet are equal to the length of the side links.

9. The flexible display device according to claim 8, wherein a distance between the two end points at the symmetric positions of the two parabolic curves respectively is less than a sum of the lengths of the two connecting rods.

10. The flexible display device according to claim 9, wherein a side of the first cabinet opposite to the second cabinet is further provided with a first recess, and when the two jointed axes between the two side links and the two connecting rods move to positions corresponding to the first cabinet, at least the jointed axes are in the first recess.

11. The flexible display device according to claim 10, wherein the side of the first cabinet opposite to the second cabinet is further provided with a second recess, and when the jointed axis between the two connecting rods moves to positions corresponding to the first cabinet, at least the jointed axis is in the second recess.

12. The flexible display device according to claim 11, wherein the locking mechanism comprises: a latch and a latch mate configured to fix the relative position of the first cabinet and the second cabinet, and an elastomer configured to fix the relative position of the adjusting lever, wherein an end of the elastomer is connected with the push-pull end of the first cabinet, and the other end of the elastomer is connected with the adjusting lever.

13. The flexible display device according to claim 12, wherein in the direction perpendicular to the direction in which the second cabinet moves, a side surface of the first cabinet is outside a side surface of the second cabinet;
wherein the latch mate is formed by a plurality of locating holes on the side surface of the second cabinet,
wherein the latch assembly comprises a latch button, a buckle with a rotary axis, a spring; wherein the latch button is provided with a catch slot; the spring is sheathed on the latch button, and one end of the spring is in contact with a sidewall of the first cabinet, the other end of the spring is connected with the latch button; a first end of the buckle is jammed into the catch slot, and the buckle is rotatable around the rotary axis, and the rotary axis is fixed to the sidewall of the first cabinet;

when the latch button is in an initial state, a second end of the buckle is jammed into the locating holes; when the latch button is in a pressed state, the spring is compressed and the catch slot produces a displacement and drives the buckle to rotate around the rotary axis so that the second end of the buckle exits the locating hole; when the latch button is in a rebounded state, the spring is rebounded and drives the latch button back to the initial state.

14. The flexible display device according to claim 1, wherein the second cabinet has a cavity structure, wherein the adjusting lever is in the cavity structure, and a lower surface of the guiding portion is approximately in the same horizontal plane as the adjusting lever.

15. The flexible display device according to claim 1, wherein the upper surface of the second cabinet is provided with two curved grooves, and the two curved grooves are symmetrical with respect to the perpendicular bisector of the frame, and two jointed axes between the two side links and the two connecting rods are in the two curved grooves respectively.

16. The flexible display device according to claim 15, wherein the two curved grooves are of the shapes of two parabolic curves with a set of opposite sides defining openings respectively facing the direction perpendicular to the direction in which the second cabinet moves, and a distance from an end point of the parabolic curves close to the push-pull end of the second cabinet to the push-pull end of the second cabinet and a distance from the other end of the parabolic curves to the end of the second cabinet opposite to the push-pull end of the second cabinet are equal to the length of the side links.

17. The flexible display device according to claim 1, wherein a side of the first cabinet opposite to the second cabinet is further provided with a first recess, and when the two jointed axes between the two side links and the two connecting rods move to positions corresponding to the first cabinet, at least the jointed axes are in the first recess.

18. The flexible display device according to claim 1, wherein the locking mechanism comprises: a latch and a latch mate configured to fix the relative position of the first cabinet and the second cabinet, and an elastomer configured to fix the relative position of the adjusting lever, wherein an end of the elastomer is connected with the push-pull end of the first cabinet, and the other end of the elastomer is connected with the adjusting lever.

* * * * *